(12) United States Patent
Kelly et al.

(10) Patent No.: US 9,040,349 B2
(45) Date of Patent: May 26, 2015

(54) METHOD AND SYSTEM FOR A SEMICONDUCTOR DEVICE PACKAGE WITH A DIE TO INTERPOSER WAFER FIRST BOND

(71) Applicants: Michael G. Kelly, Queen Creek, AZ (US); Ronald Patrick Huemoeller, Gilbert, AZ (US); Won Chul Do, Bucheon-si (KR); David Jon Hiner, Chandler, AZ (US)

(72) Inventors: Michael G. Kelly, Queen Creek, AZ (US); Ronald Patrick Huemoeller, Gilbert, AZ (US); Won Chul Do, Bucheon-si (KR); David Jon Hiner, Chandler, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 13/678,046

(22) Filed: Nov. 15, 2012

(65) Prior Publication Data

US 2014/0134796 A1    May 15, 2014

(51) Int. Cl.
*H01L 21/50* (2006.01)

(52) U.S. Cl.
CPC ...................................... *H01L 21/50* (2013.01)

(58) Field of Classification Search
USPC .......................................................... 438/109
See application file for complete search history.

(56) References Cited

U.S. PATENT DOCUMENTS

| 2004/0150118 | A1* | 8/2004 | Honda | 257/778 |
| 2007/0232026 | A1 | 10/2007 | Apanius et al. | |
| 2008/0169545 | A1* | 7/2008 | Kwon et al. | 257/686 |
| 2010/0072594 | A1* | 3/2010 | Kerr et al. | 257/678 |
| 2010/0133704 | A1 | 6/2010 | Marimuthu et al. | |
| 2011/0308739 | A1* | 12/2011 | McCutcheon et al. | 156/766 |
| 2011/0312157 | A1 | 12/2011 | Lei et al. | |
| 2012/0074585 | A1* | 3/2012 | Koo et al. | 257/774 |
| 2012/0146177 | A1 | 6/2012 | Choi et al. | |
| 2012/0193779 | A1 | 8/2012 | Lee et al. | |
| 2012/0211885 | A1 | 8/2012 | Choi et al. | |
| 2012/0228749 | A1 | 9/2012 | Pagaila | |
| 2012/0238057 | A1* | 9/2012 | Hu et al. | 438/107 |
| 2012/0241965 | A1* | 9/2012 | Hu et al. | 257/773 |
| 2013/0187258 | A1* | 7/2013 | Lu et al. | 257/621 |
| 2013/0217188 | A1* | 8/2013 | Wang et al. | 438/118 |

OTHER PUBLICATIONS

PCT, Notification of Transmittal of the International Search Report and the Written Opinion of the International Searching Authority, or the Declaration, in International application No. PCT/US13/68510 dated Mar. 28, 2014. (11 pages).

* cited by examiner

*Primary Examiner* — Angel Roman
(74) *Attorney, Agent, or Firm* — McAndrews, Held & Malloy

(57) ABSTRACT

Methods and systems for a semiconductor device package with a die to interposer wafer first bond are disclosed and may include bonding a plurality of semiconductor die comprising electronic devices to an interposer wafer, and applying an underfill material between the die and the interposer wafer. A mold material may be applied to encapsulate the die. The interposer wafer may be thinned to expose through-silicon-vias (TSVs) and metal contacts may be applied to the exposed TSVs. The interposer wafer may be singulated to generate assemblies comprising the semiconductor die and an interposer die. The die may be placed on the interposer wafer utilizing an adhesive film. The interposer wafer may be singulated utilizing one or more of: a laser cutting process, reactive ion etching, a sawing technique, and a plasma etching process. The die may be bonded to the interposer wafer utilizing a mass reflow or a thermal compression process.

20 Claims, 12 Drawing Sheets

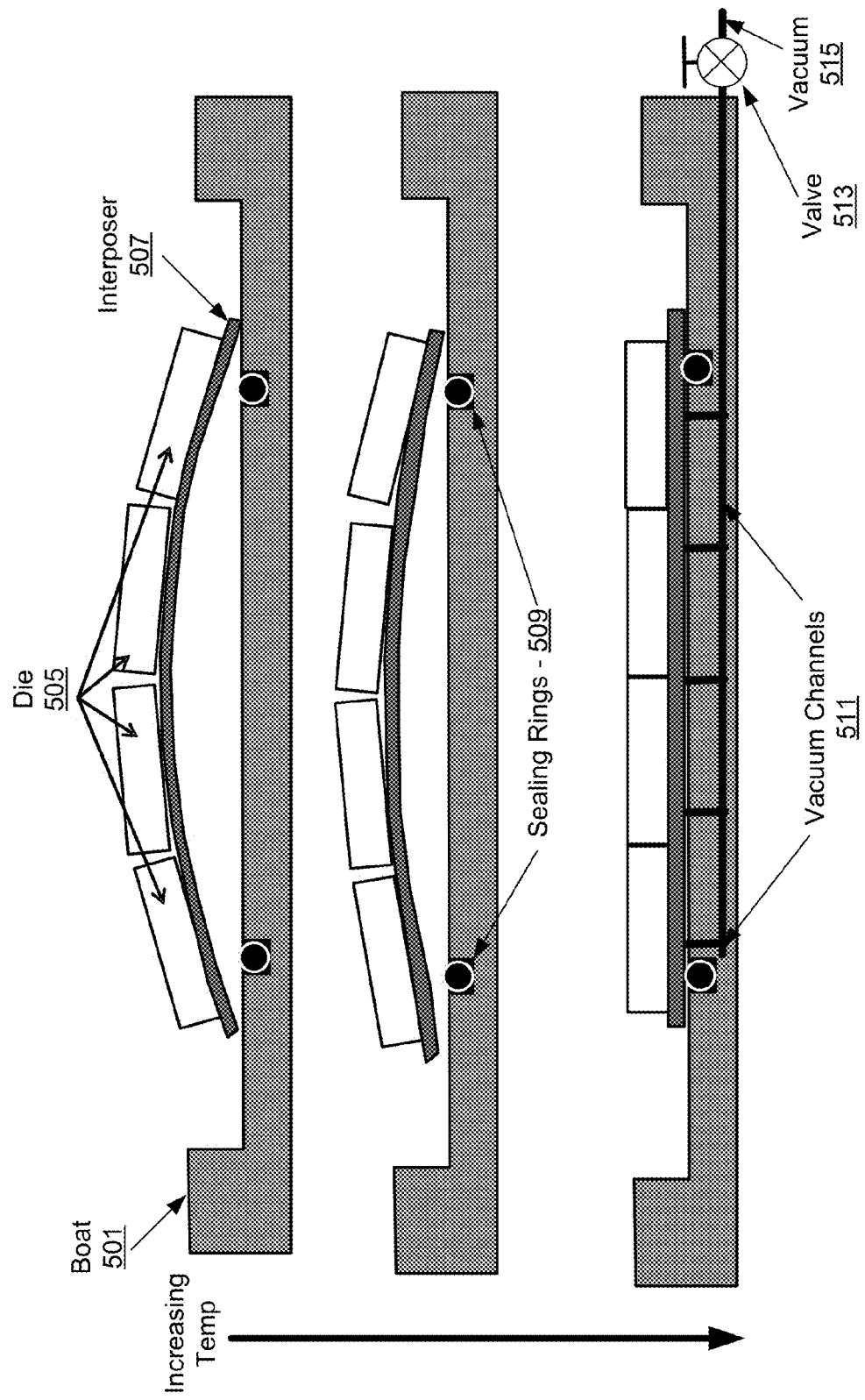

METHOD AND SYSTEM FOR A SEMICONDUCTOR DEVICE PACKAGE WITH A DIE TO INTERPOSER WAFER FIRST BOND

CROSS-REFERENCE TO RELATED APPLICATIONS/INCORPORATION BY REFERENCE

This application is related to U.S. application Ser. No. 13/678,058, filed on even date herewith, and U.S. application Ser. No. 13/678,012, filed on even date herewith. Each of the above cited applications is incorporated herein by reference in its entirety.

FIELD OF THE INVENTION

Certain embodiments of the invention relate to semiconductor chip packaging. More specifically, certain embodiments of the invention relate to a method and system for a semiconductor device package with a die to interposer wafer first bond.

BACKGROUND OF THE INVENTION

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprises ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present invention as set forth in the remainder of the present application with reference to the drawings.

BRIEF DESCRIPTION OF SEVERAL VIEWS OF THE DRAWINGS

FIG. 5 is a diagram illustrating a vacuum planarizing apparatus, in accordance with an example embodiment of the invention.

DETAILED DESCRIPTION OF THE INVENTION

Certain aspects of the invention may be found in a method and system for a semiconductor device package with a die to interposer wafer first bond. Example aspects of the invention may comprise bonding a plurality of semiconductor die comprising electronic devices to an interposer wafer, and applying an underfill material between the plurality of semiconductor die and the interposer wafer. A mold material may be applied to encapsulate the plurality of semiconductor die. The interposer wafer may be thinned to expose through-silicon-vias (TSVs) and metal contacts may be applied to the exposed TSVs. The interposer wafer may be singulated to generate a plurality of assemblies each comprising one or more of the plurality of semiconductor die and an interposer die. The one or more of the plurality of assemblies may be bonded to one or more packaging substrates. The plurality of die may be placed on the interposer wafer for the bonding utilizing an adhesive film. The interposer wafer may be singulated utilizing one or more of: a laser cutting process, reactive ion etching, a sawing technique, and a plasma etching process. The underfill material may be applied utilizing a capillary underfill process. The plurality of semiconductor die may be bonded to the interposer wafer utilizing a mass reflow process or a thermal compression process. The one or more additional die may be bonded to the plurality of semiconductor die utilizing a mass reflow process or a thermal compression process. The mold material may comprise a polymer. The one or more additional die may comprise micro-bumps for coupling to the plurality of semiconductor die.

Figure 1A:
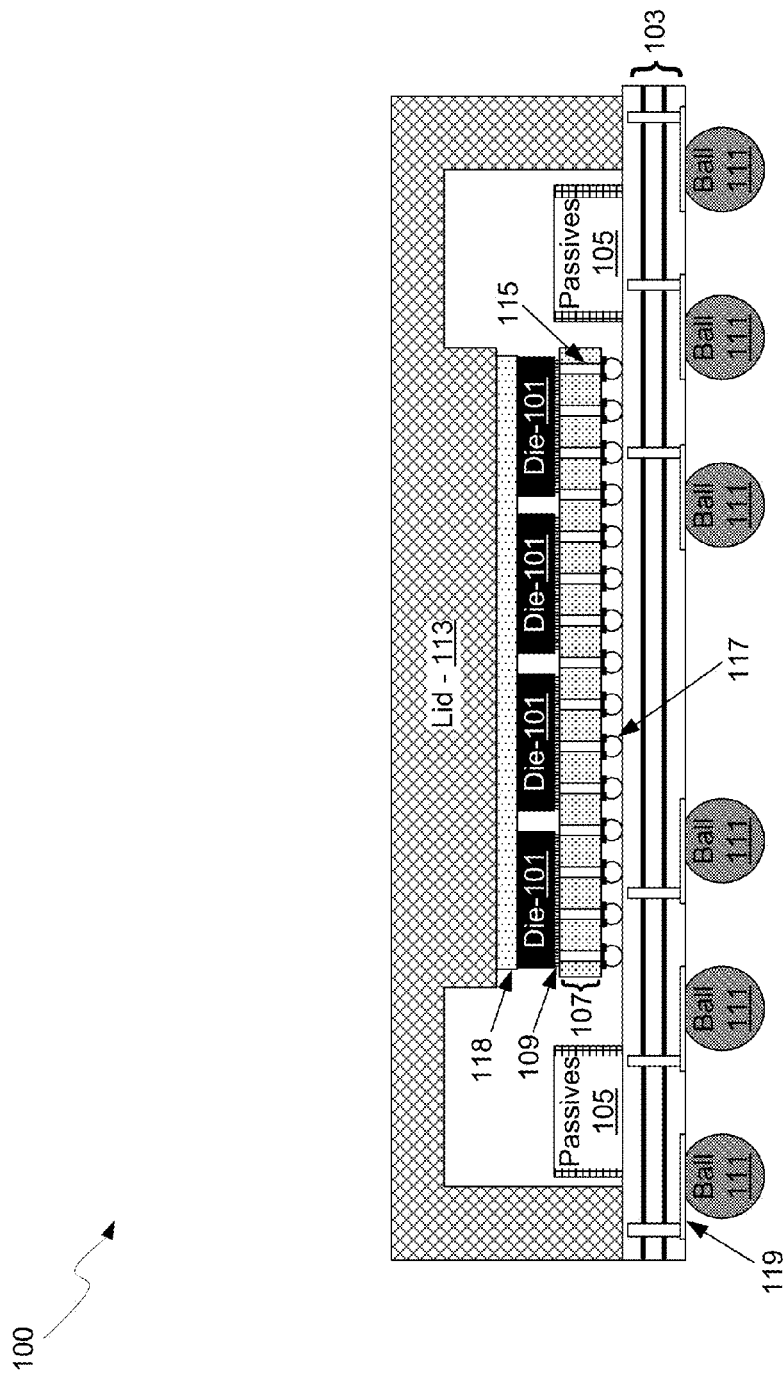
FIG. 1A is a schematic illustrating an integrated circuit package configured with a die-to-wafer first bond, in accordance with an example embodiment of the invention.

FIG. 1A is a schematic illustrating an integrated circuit package configured with a die-to-wafer first bond, in accordance with an example embodiment of the invention. Referring to FIG. 1A, there is shown a package 100 comprising die 101, a packaging substrate 103, passive devices 105, an interposer 107, solder balls 111, a lid 113, and thermal interface material 118.

The die 101 may comprise integrated circuit die that have been separated from one or more semiconductor wafers. The die 101 may comprise electrical circuitry such as digital signal processors (DSPs), network processors, power management units, audio processors, RF circuitry, wireless baseband system-on-chip (SoC) processors, sensors, and application specific integrated circuits, for example. In addition, the die 101 may comprise micro-bumps 109 for providing electrical contact between the circuitry in the die 101 and contact pads on the surface of the interposer 107.

The interposer 107 may comprise a semiconductor wafer, such as a silicon wafer, with through-silicon-vias (TSVs) 115 that provide electrically conductive paths from one surface of the interposer 107 to the opposite surface. The interposer 107 may also comprise backside bumps 117 for making electrical and mechanical contact to the packaging substrate 103. In another example scenario, the interposer 107 may comprise glass or an organic laminate material, either of which may be capable of large panel formats on the order of 500×500 mm, for example.

The packaging substrate 103 may comprise a mechanical support structure for the interposer 107, the die 101, the passive devices 105, and the lid 113. The packaging substrate 103 may comprise solder balls 111 on the bottom surface for providing electrical contact to external devices and circuits, for example. The packaging substrate 103 may also comprise conductive traces in a non-conductive material for providing conductive paths from the solder balls to the die 101 via pads that are configured to receive the backside bumps 117 on the interposer 107. Additionally, the packaging substrate 103 may comprise pads 119 for receiving the solder balls 111. The pads 119 may comprise one or more under-bump metals, for example, for providing a proper electrical and mechanical contact between the packaging substrate 103 and the solder balls 111.

The passive devices 105 may comprise electrical devices such as resistors, capacitors, and inductors, for example, which may provide functionality to devices and circuits in the die 101. The passive devices 105 may comprise devices that may be difficult to integrate in the integrated circuits in the die 101, such as high value capacitors or inductors. In another example scenario, the passive devices 105 may comprise one or more crystal oscillators for providing one or more clock signals to the die 101.

The lid 113 may provide a hermetic seal for the devices within the cavity defined by the lid 110 and the packaging substrate 103. A thermal interface may be created for heat transfer out of the die 101 to the lid 113 via the thermal interface material 118, which may also act as an adhesive.

In an example scenario, the package 100 may be fabricated by first bonding the die 101 to the interposer 107 when the interposer is still part of a full wafer of interposer die, and may be bonded utilizing a mass reflow or thermal compression process. The interposer wafer with attached die 101 may be processed for further assembly. For example, the interposer wafer may be thinned and the backside bumps 117 may be deposited. Furthermore, a capillary underfill material may be placed between the die 101 and the interposer before a mold process is utilized to encapsulate the die 101 on the individual interposer die in the interposer wafer.

An assembly comprising the die 101 and the interposer wafer may be singulated and the singulated assembly may then be bonded to the packaging substrate 103 utilizing either mass reflow or thermal compression. The lid 113 may be placed on the bonded assembly to provide a hermetic seal and protect the circuitry from the external environment. Finally, electrical tests may be performed following the bonding processes to verify that proper electrical connections were made and no shorts or open circuits exist.

Figure 1B:
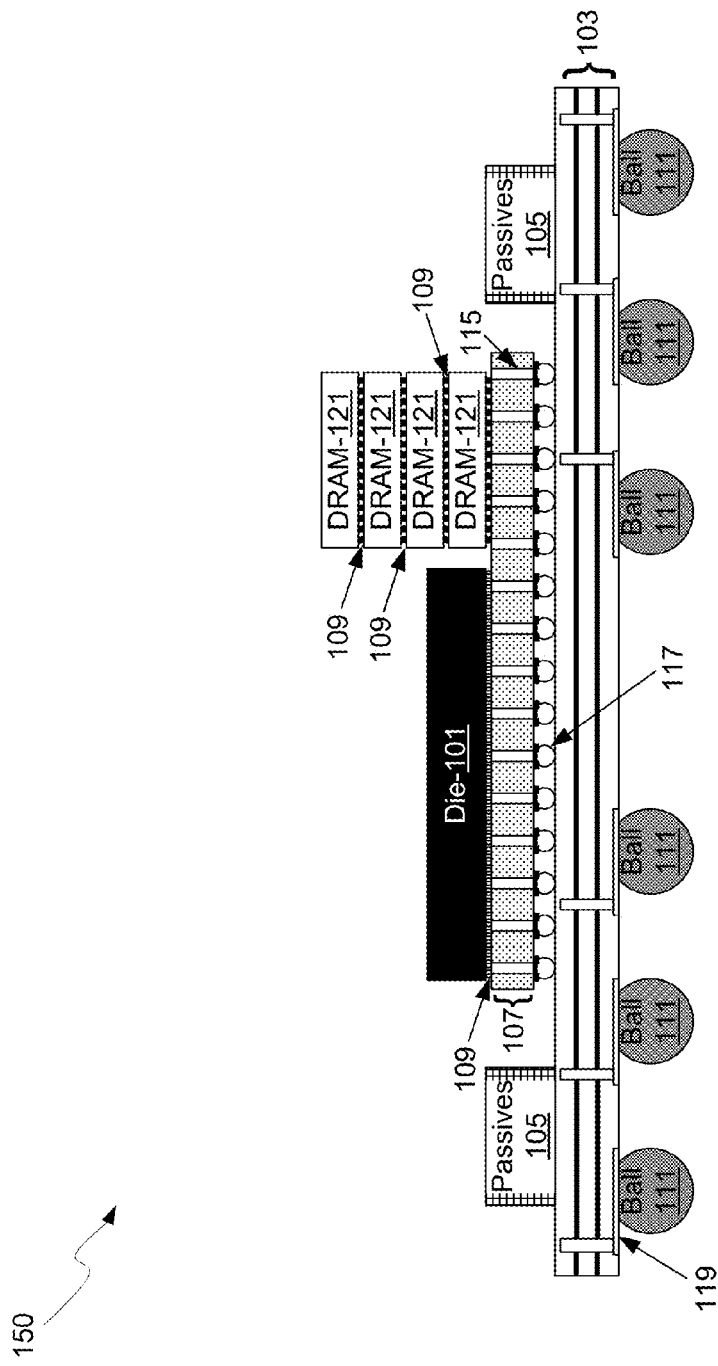
FIG. 1B is a schematic illustrating an integrated circuit package configured with a die to interposer wafer first bond and stacked die, in accordance with an example embodiment of the invention.

FIG. 1B is a schematic illustrating an integrated circuit package configured with a die to interposer wafer first bond and stacked die, in accordance with an example embodiment of the invention. Referring to FIG. 1B, there is shown a package 150 comprising the die 101, the packaging substrate 103, the passive devices 105, the interposer 107, and a stack of dynamic random access memory (DRAM) 121. The die 101, the packaging substrate 103, the passive devices 105, and the interposer 107 may be substantially as described with respect to FIG. 1A, for example, but with different electrical connectivity for the different die 101 and the stack of DRAM 121.

The DRAM 121 may comprise a stack of die for providing a high density memory for circuitry in the die 101 or external to the package 150. The DRAM 121 may be stacked front-to-back and therefore comprise TSV's for providing electrical connectivity between the individual die.

In an example scenario, the package 150 may be fabricated by first bonding the die 101 and the DRAM 121 to the interposer 107 when still in wafer form, i.e. before singulation into individual interposer die. The die 101 and the DRAM 121 may be bonded utilizing mass reflow or thermal compression process. The interposer wafer and bonded die may be singulated into separate functional die/interposer die assemblies before being bonded to the packaging substrate 103. Furthermore, a capillary underfill process may follow the bonding processes for mechanical and insulating purposes. Electrical tests may be performed following the bonding processes to verify that proper electrical connections were made and no shorts or open circuits exist.

Figures 1C, 1D, 1E:
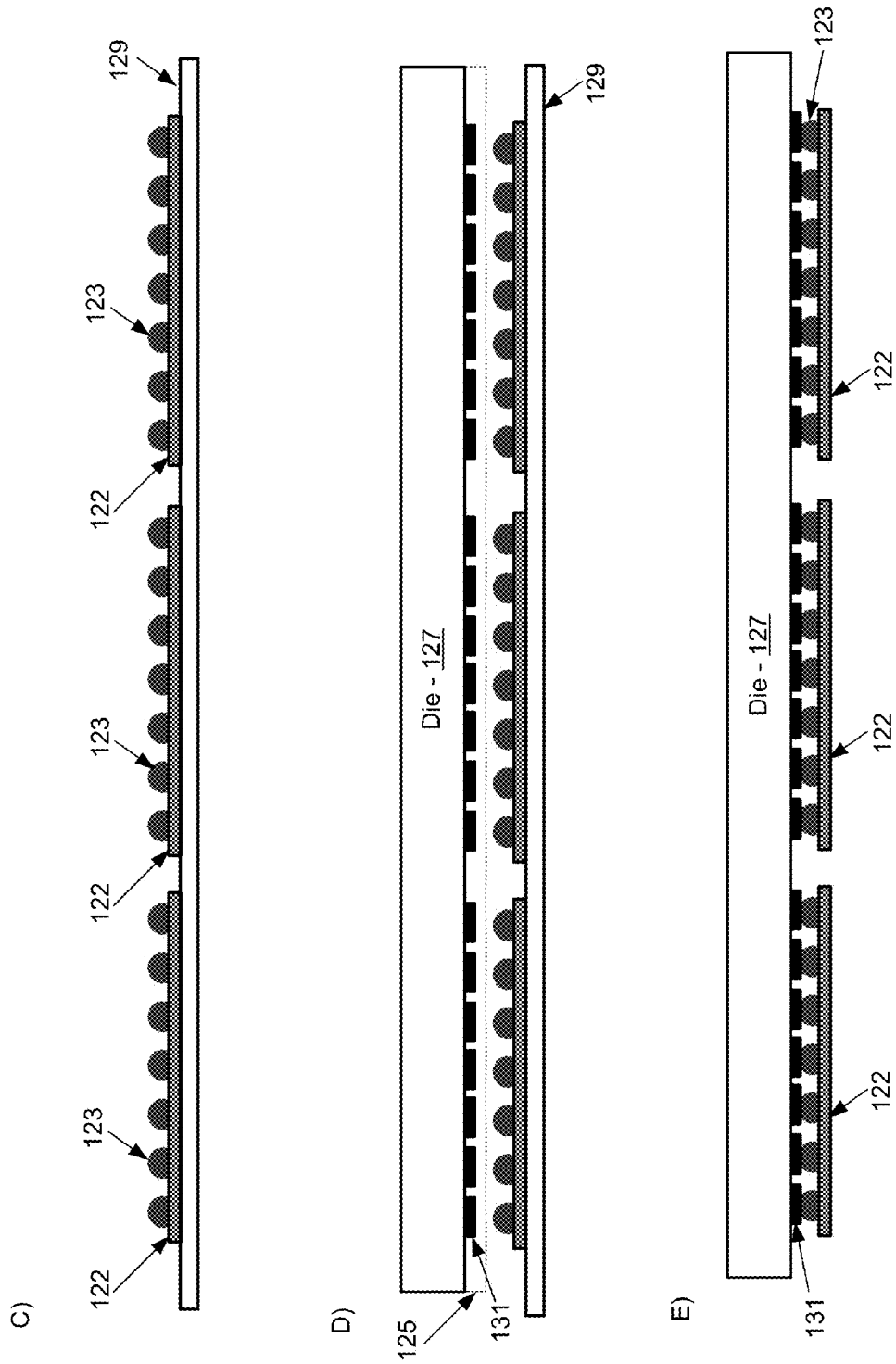
FIGS. 1C-1E illustrate example steps for bonding multiple die utilizing an adhesive film, in accordance with an example embodiment of the invention.

FIGS. 1C-1E illustrate example steps for bonding multiple die utilizing an adhesive film, in accordance with an example embodiment of the invention. Referring to FIG. 1C, there is shown a plurality of die 122 and an adhesive layer 129. Each of the plurality of die 122 may comprise metal interconnects 123 for subsequent bonding to other die. In another example scenario, the metal interconnects 123 may comprise microbumps or copper pillars, for example.

The adhesive film 129 may comprise an adhesive tape or compliant layer, for example, to which the plurality of die 122 may be bonded, as illustrated in FIG. 1C. The adhesive film 129 may be a temporary adhesive for attaching multiple die to other die within a wafer. For example, the interposer 127 may comprise a wafer of individual interposer die (in which case the interposer 127 comprises an "interposer wafer"). In an example scenario, the plurality of die 122 may be placed temporarily on the adhesive film 129. While FIG. 1C illustrates the plurality of die 122 as consisting of three die, more or less die (including a single die) are also possible and contemplated.

An optional underfill material 125 may also be placed on the interposer wafer 127 as illustrated by underfill material 125 in FIG. 1D, before bonding the plurality of die 122 to the interposer 127 utilizing the adhesive film 129. The underfill material 125 may be for subsequent thermal compression bonding processes, for example, and may allow instant underfill through a snap cure during a subsequent thermal compression bonding process. This may improve bonding yields since a single underfill process may be utilized for the plurality of die 122 as compared to a separate place and underfill process for each of the die 122. The plurality of die 122 may be placed face up so that the metal interconnects 123 may be coupled to a receiving die.

The plurality of die 122 on the adhesive film 129 may then be placed on the interposer 127, as shown in FIGS. 1D and 1E, where the initial placement of the plurality of die 122 on the adhesive film 129 may enable fine control of the spacing and alignment of the plurality of die 122 with the interposer 127. In an example scenario, the interposer 127 may be gang bonded to the individual die 122. The interposer 127 may comprise metal pads 131 for receiving the metal interconnects 123. Once the plurality of die 122 are placed on the interposer 127, a thermal compression bond process may be performed for proper electrical and mechanical bonds between the metal interconnects 123 and the metal pads 131. Once bonded, the adhesive film 129 may be removed resulting in the structure shown in FIG. 1E.

Figures 2A, 2B:
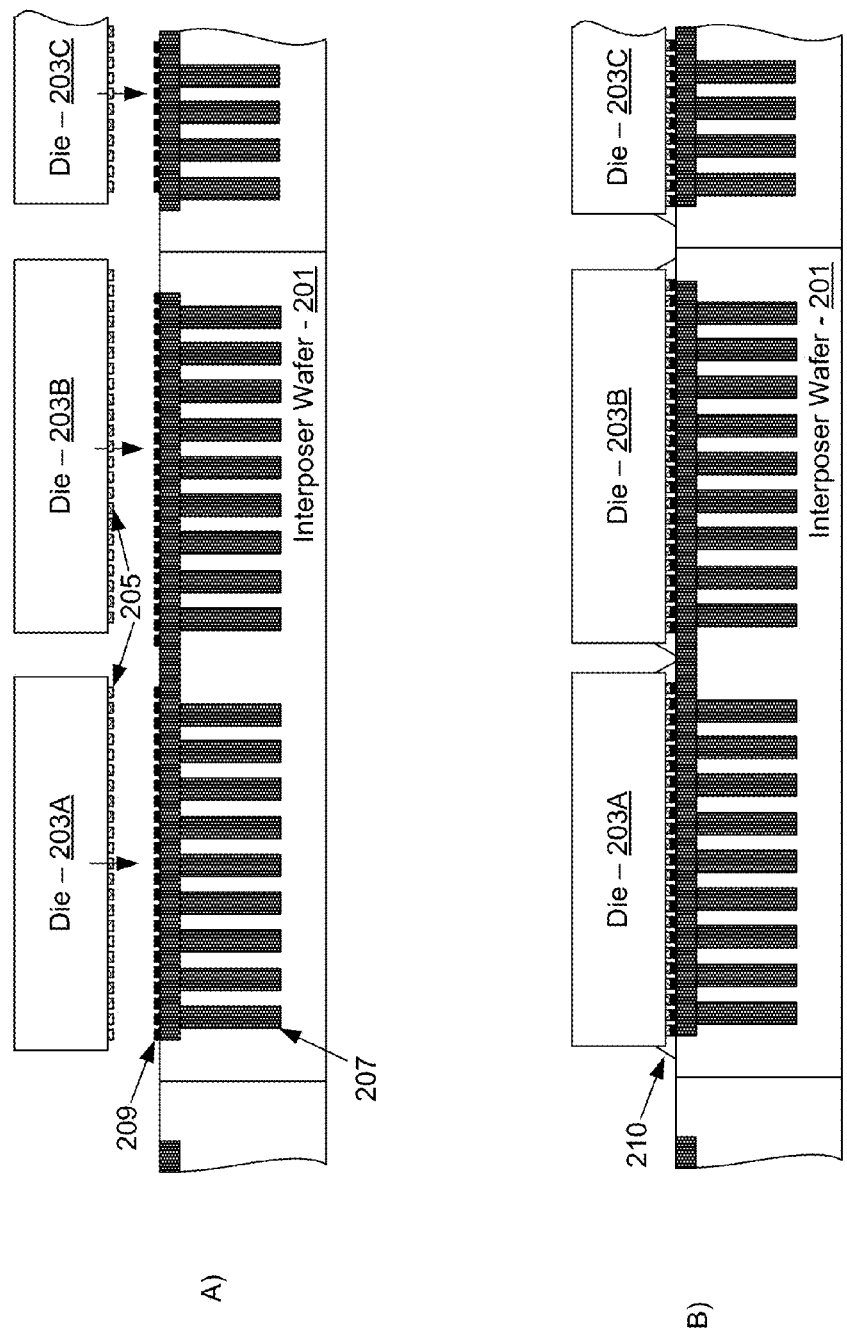
FIGS. 2A-2F illustrate example steps in a die to interposer wafer first bond structure, in accordance with an example embodiment of the invention.

FIGS. 2A-2F illustrate example steps in a die to interposer wafer first bond structure, in accordance with an example embodiment of the invention. Referring to FIG. 2A, there is shown an interposer wafer 201 and a plurality of die 203A-203C. The die 203A-203C may comprise integrated circuit die that have been separated from one or more semiconductor wafers. The die 203A-203C may comprise electrical circuitry such as digital signal processors (DSPs), network processors, power management units, audio processors, RF circuitry, wireless baseband system-on-chip (SoC) processors, sensors, and application specific integrated circuits, for example. In addition, the die 203A-203C may comprise micro-bumps 205 for providing electrical contact between the circuitry in the die 203A-203C and front side pads 209 on the surface of the interposer wafer 201.

The interposer wafer 201 may comprise a plurality of individual interposer die, each of which may be coupled to one or more die, such as the die 203A-203C. The interposer wafer 201 may also comprise front side pads 209 for providing electrical contact to the die 203A-203C. Furthermore, the interposer wafer 201 may comprise through-silicon-vias (TSVs) 207 for providing electrically conductive paths from one surface of the interposer to the other, once the interposer wafer 201 has been thinned.

Figures 2C, 2D:
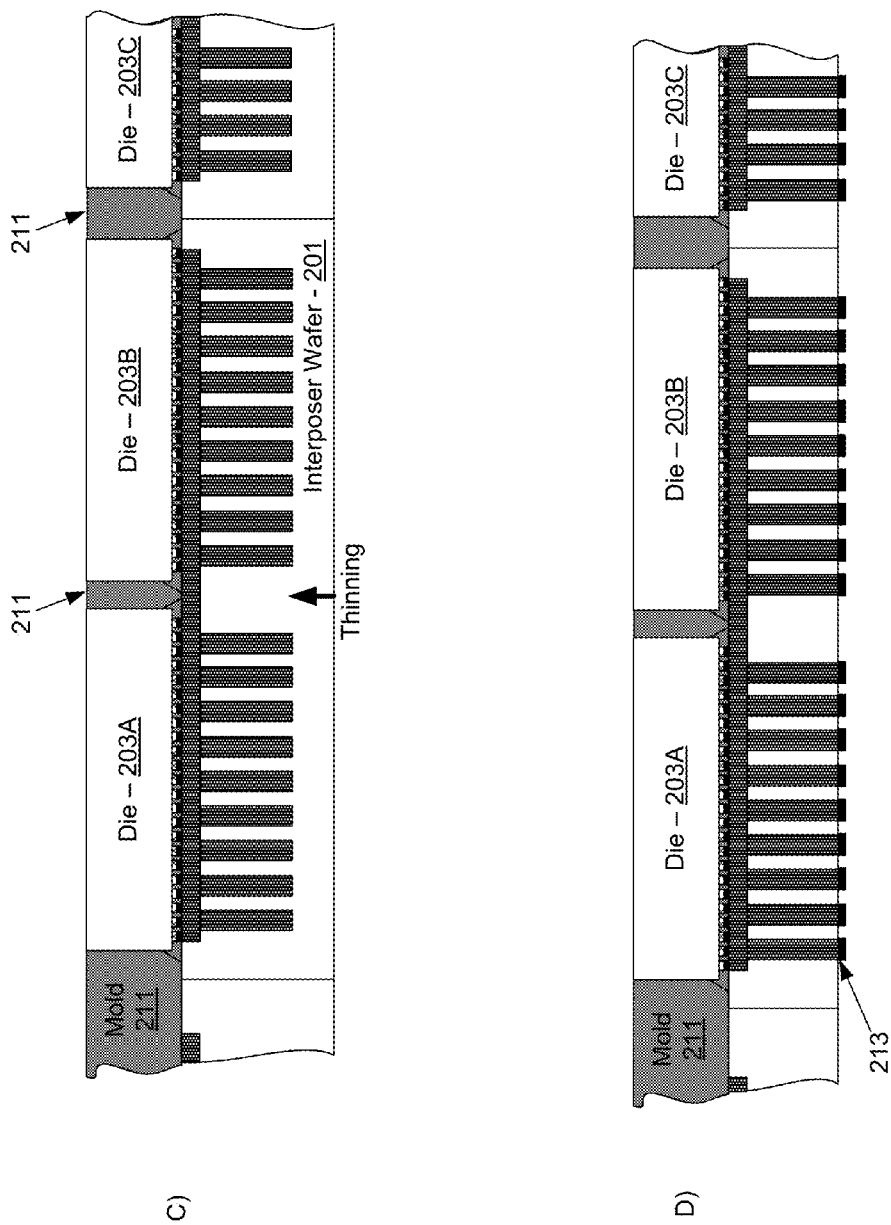

The die 203A-203C may be placed on the interposer wafer 201 and bonded using a thermal compression bonding technique, for example. In another example scenario, a mass reflow process may be utilized to bond the die 203A-203C. A non-conductive paste (NCP) may also be utilized to assist in forming the bonds. In addition, a capillary underfill may then be applied and may fill the volume between the die 203A-203C and the interposer wafer 201. FIG. 2B illustrates the die 203A-203C bonded to the interposer wafer 201 with underfill material 210. When deposited or placed, the underfill material 210 may comprise a film, paste, b-stage film, or a liquid, for example The space between the die 203A-203C may be filled with a mold material 211, as illustrated in FIG. 2C. The mold material 211 may comprise a polymer material, for example, that may provide a non-conductive structural support for die bonded to the interposer wafer 201, protecting the die in subsequent processing steps and when diced into individual packages. In an example scenario, the interposer wafer 201 may be thinned utilizing a back side polish or grind, for example, to expose the TSVs.

While the underfill material 210 is shown in FIGS. 2B-2F, the mold material itself may be utilized as underfill material for each coupling interface, such as between the die 203A and 203B and the interposer wafer 201. In another example embodiment, underfill material may be inserted as a liquid or paste, placed as a film, or a b-staged film and may be placed sequentially as each die to substrate or die to die bond is made, or may be made all at one time after all the electrical bonds are made.

In another example scenario, the interposer wafer 201 may be thinned to a thickness where the TSVs are still slightly covered, which may then be etched selectively in areas covering the TSVs. A protective layer may then be deposited over the remaining silicon and a polish of the exposed TSVs may be performed for improved contact to the TSVs. Additionally, metal pads may be deposited on the polished TSVs for better contact with the backside bumps 213.

After the interposer wafer 201 has been thinned, the backside bumps 213 may be deposited, as shown in FIG. 2D, for making contact between the TSVs and subsequently bonded substrates, such as packaging substrates.

The molded assembly may then be singulated utilizing a cutting technology such as reactive ion etching, plasma etching (e.g. an inductively coupled plasma), laser cutting, or mechanical saw. In an example scenario, the molded assembly may be partially cut and the separated with a mechanical pulling apart of the die.

Figures 2E, 2F:
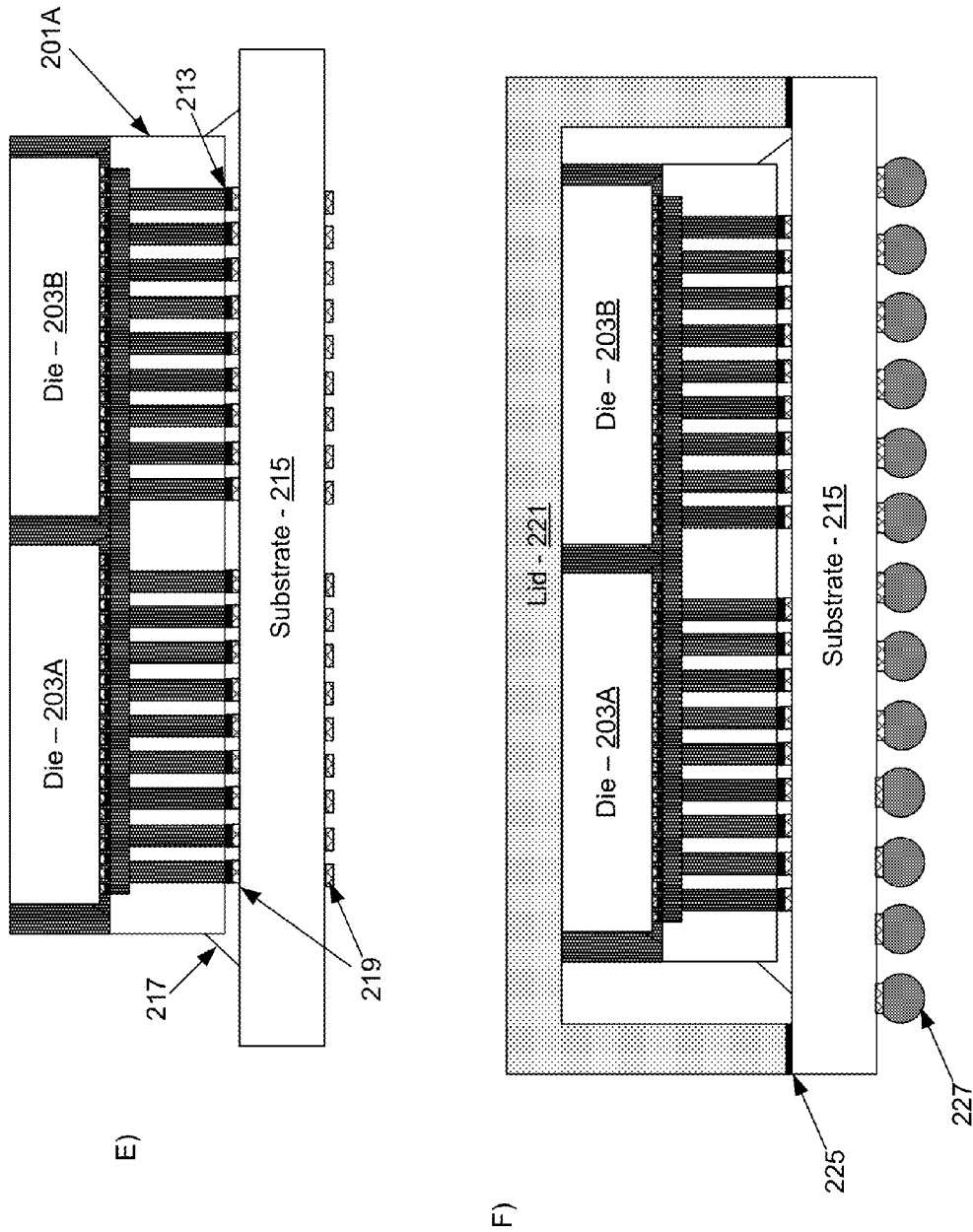

The singulated molded die/interposer assembly comprising the die 203A-203B and the interposer die 201A may then be bonded to the packaging substrate 215 via the backside bumps 213, as illustrated in FIG. 2E. The packaging substrate 215 may comprise contact pads 219 for making contact with the backside bumps 213 on the interposer die 201A and for subsequent placement of solder balls 227 as shown in FIG. 2F.

In addition, the lid 221 may be placed on the package assembly with a hermetic seal made with an adhesive 225 at the surface of the packaging substrate 215, which may also comprise a thermal interface material. Accordingly, the lid 221 may make contact with the top surfaces of the die 203A and 203B for thermal heat sinking purposes. The solder balls 227 may comprise metal spheres for making electrical and mechanical contact with a printed circuit board, for example.

Figure 3:
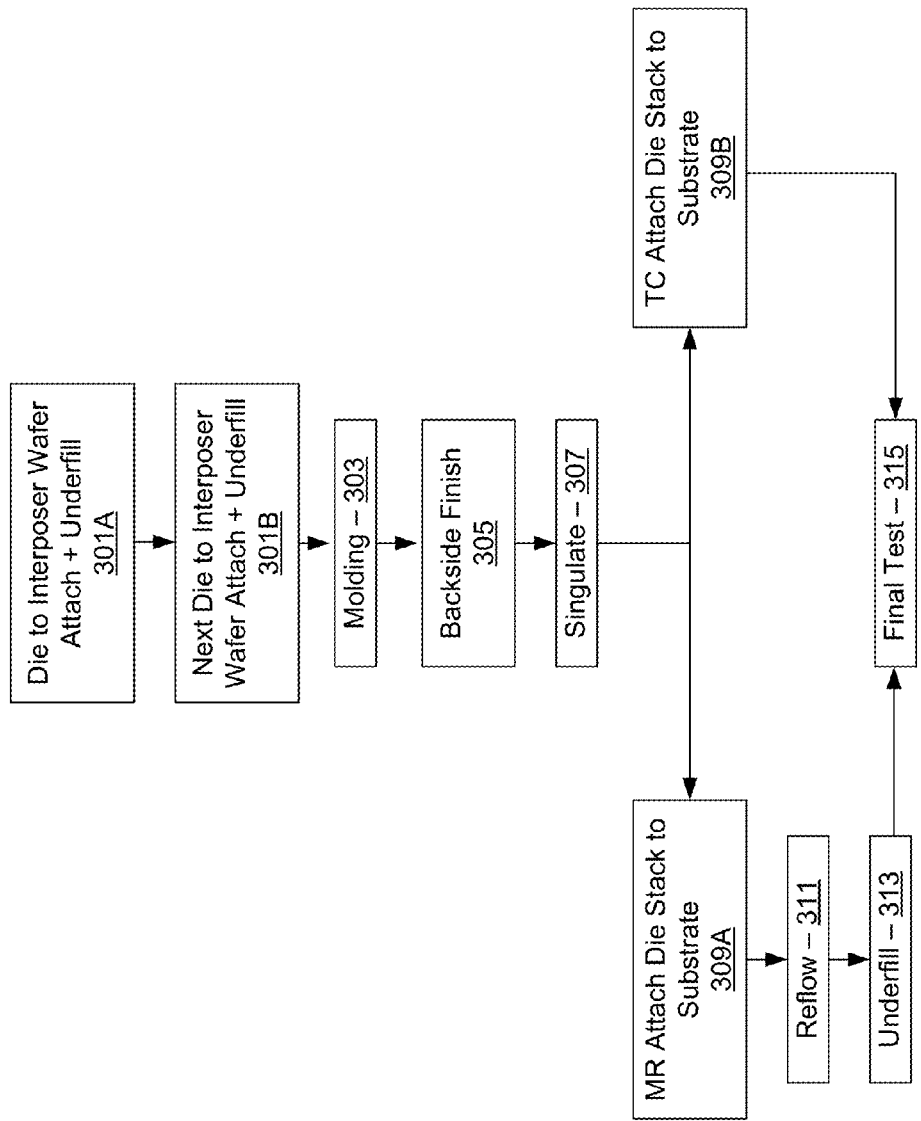
FIG. 3 is a schematic illustrating example steps in a die to interposer wafer first bond process, in accordance with an example embodiment of the invention

FIG. 3 is a schematic illustrating example steps in a die to interposer wafer first bond process, in accordance with an example embodiment of the invention. Referring to FIG. 3, there is shown a die to interposer wafer process beginning with a die to interposer wafer attach and underfill step 301A. The one or more die may be bonded utilizing a thermal compression bonding technique, for example. Additional die may also be bonded to the first bonded die, such as illustrated by the DRAM stack 121 shown in FIG. 1B, or the interposer wafer as shown in FIG. 1A, in the next die to interposer wafer attach and underfill step 301B.

A capillary underfill process may be utilized following the bonding process, which may provide an insulating barrier between contacts and may fill the volume between the die and the interposer wafer. It should be noted that the process is not limited to a thermal compression technique. Accordingly, a mass reflow process may be utilized, for example. Thermal compression bonding techniques may be advantageous at 40 micron pitch or less and white bumps, i.e. high-k dielectric layer delamination, may be eliminated with thermal compression bonding. In addition, flatness may be improved with thermal compression bonding, resulting in fewer open circuit connections due to excessive gaps.

A molding step 303 may then be utilized to package the die/interposer assembly before thinning the interposer substrate to expose the TSVs in the backside finish step 305. In addition, backside contacts may be applied to the exposed TSVs in the interposer wafer.

The molded die/interposer wafer assembly may then be singulated into a plurality of molded die on interposer die assemblies in the singulate step 307. Singulation may be performed via laser cutting, plasma etching, reactive ion etching, or a sawing technique, for example.

The singulated assemblies may then be attached to packaging substrates, utilizing either a mass reflow technique in step 309A or a thermal compression technique in step 309B, utilizing the deposited backside contacts. If the mass reflow bonding step 309A is utilized, the die/interposer/packaging substrate assembly may then be subjected to a reflow step 311 where the interposer die to packaging substrate contacts may be reflowed resulting in proper electrical and physical contact. This may be followed by a capillary underfill process at step 313 where the volume between the interposer die and the packaging substrate is underfilled, for example providing an insulating material between the contacts and filling the void to reject contamination.

If the singulated assembly is bonded to a packaging substrate utilizing a thermal compression technique in step 309B, the bonded assembly may proceed to step 315. Note that the thermal compression technique in step 309B may, for example, include applying a pre-applied underfill before thermal compression. In another example scenario, such underfill may also be applied after step 309B, for example in a process analogous to step 313.

Finally, the bonded package may be subjected to a final test step 315 for assessing the performance of the electronic circuitry in the bonded die and to test the electrical contacts made in the bonding processes.

Figure 4:
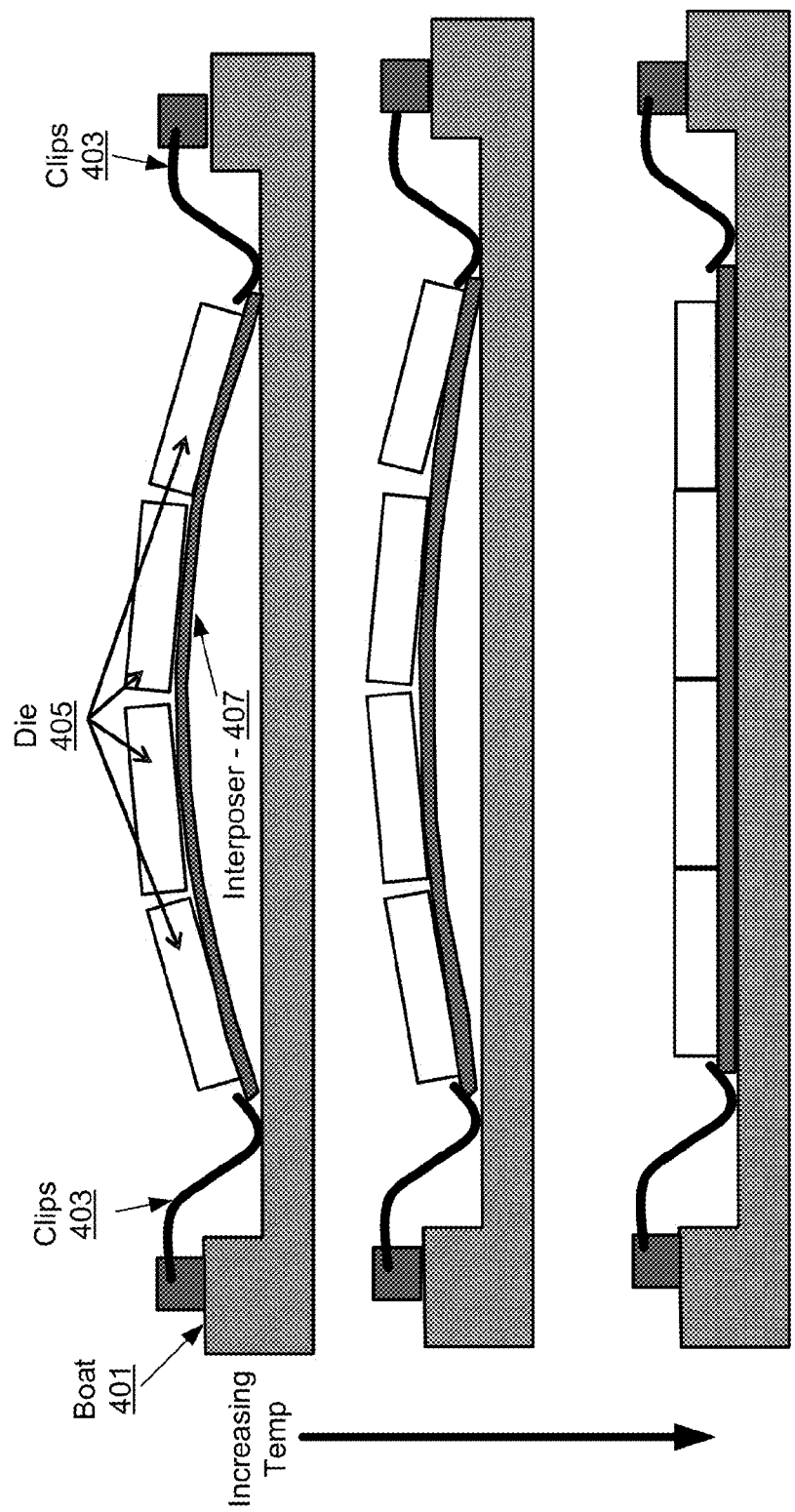
FIG. 4 is a diagram illustrating a mechanical planarizing apparatus, in accordance with an example embodiment of the invention.

FIG. 4 is a diagram illustrating a mechanical planarizing apparatus, in accordance with an example embodiment of the invention. Referring to FIG. 4, there is shown a boat 401, clips 403, a plurality of die 405, and an interposer 407. The boat 401 may comprise a rigid support structure in which a die/interposer assembly, where the interposer 407 may be in wafer form, may be placed and held in place by the clips 403. The boat 401 may be capable of withstanding high temperatures, above 200 C., for example used for processing the die/interposer assembly.

The plurality of die 405 may be bonded to the interposer 407 via a thermal compression bonding, technique, for example, prior to being placed in the boat 401. As the temperature of the boat 401 the plurality of die 405, and the interposer 407 increases, the curvature of an assembly comprising the plurality of die 405 and the interposer 407 may flatten with the clips 403 providing a downward force at the outer edges of the assembly. As the curvature approaches zero, the increased length in the lateral direction may be accommodated by sliding under the clips 403. In addition, the boat 401 provides mechanical support in conjunction with the downward force of the clips 403, thereby planarizing the assembly.

The boat 401 and clips 403 may permit the partially assembled package to heat up in normal fashion, but when the die/interposer assembly has become flat with increased temperature, the boat 401 and clips 403 resist the normal progression of the warpage, holding the partially assembled package, flattening it during heating and then maintaining that flatness of the silicon interposer as temperatures climb higher.

FIG. 5 is a diagram illustrating a vacuum planarizing apparatus, in accordance with an example embodiment of the invention. Referring to FIG. 5, there is shown a boat 501, a plurality of die 505, an interposer 507, vacuum sealing rings 509, vacuum channels 511, a valve 513, and a vacuum supply 515.

In an example scenario, the boat 501 comprises a vacuum system to flatten the partially assembled package comprising the plurality of die 505 and the interposer 507. In an example scenario, the boat 501 may accept die/interposer assemblies when the interposer 507 is still in wafer form. The vacuum-mechanical system permits the partially assembled package to heat up in normal fashion, but when the partially assembled package has become flat, the vacuum-mechanical system resists the normal progression of the warpage, holding the partially assembled package in a flattened configuration during heating and then maintains that flatness of the silicon interposer 507 as temperatures increases.

The vacuum may be applied at room temperature or slightly elevated temperatures utilizing the vacuum supply 515 via the valve 513 and the vacuum channels 511, and may be held utilizing the high-temperature sealing rings 509 so that the vacuum-mechanical boat 501 may travel through a standard reflow furnace and still maintain sufficient vacuum to maintain interposer silicon top surface planarity.

Figures 6A, 6B, 6C:
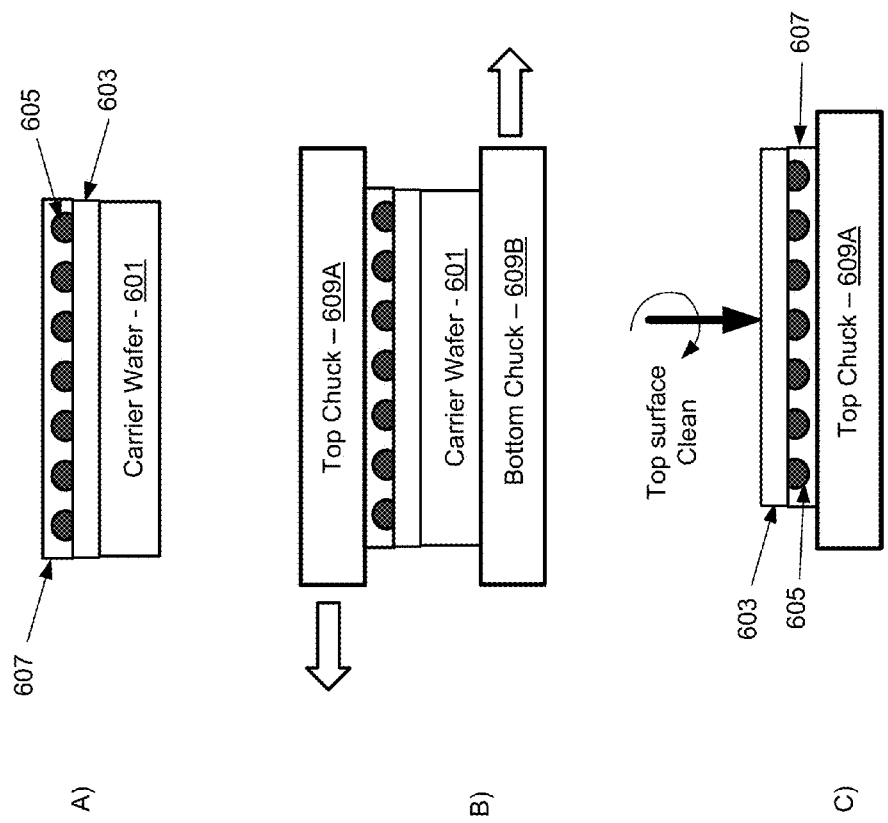
FIGS. 6A-6E illustrate example steps for debonding wafers with large backside bumps, in accordance with an example embodiment of the invention.

FIGS. 6A-6E illustrate example steps for debonding wafers with large backside bumps, in accordance with an example embodiment of the invention. Referring to FIG. 6A, there is show a carrier wafer 601, a wafer 603 with backside bumps 605, and a polymer layer 607.

The wafer 603 may comprise an electronics, or functional, wafer or an interposer wafer, for example, which may comprise large backside bumps 605 that may be susceptible to damage in debond processes. Accordingly, the polymer layer 607 may be applied to protect the backside bumps 605 during debond processes. The polymer layer 607 may comprise a resist material or an adhesive film or tape, for example, that may be applied on the wafer 603 over the backside bumps 605.

A subsequent chuck attachment, such as with a vacuum technique, to the carrier wafer 601 and the top surface of the polymer layer 607 is shown in FIG. 6B. The top chuck 609A may be moved in one lateral direction while the bottom chuck 609B may be moved in the opposite direction to separate the carrier wafer 601 from the wafer 603. The polymer layer 607 may enable a proper vacuum seal to the surface, where there may be a poor seal when applied directly to the backside bumps 605.

FIG. 6C shows the resulting structure following debond from the carrier wafer 601. Any adhesive residue remaining from the carrier wafer 601 may be removed in a cleaning process while still attached to the top chuck 609A.

Figures 6D, 6E:
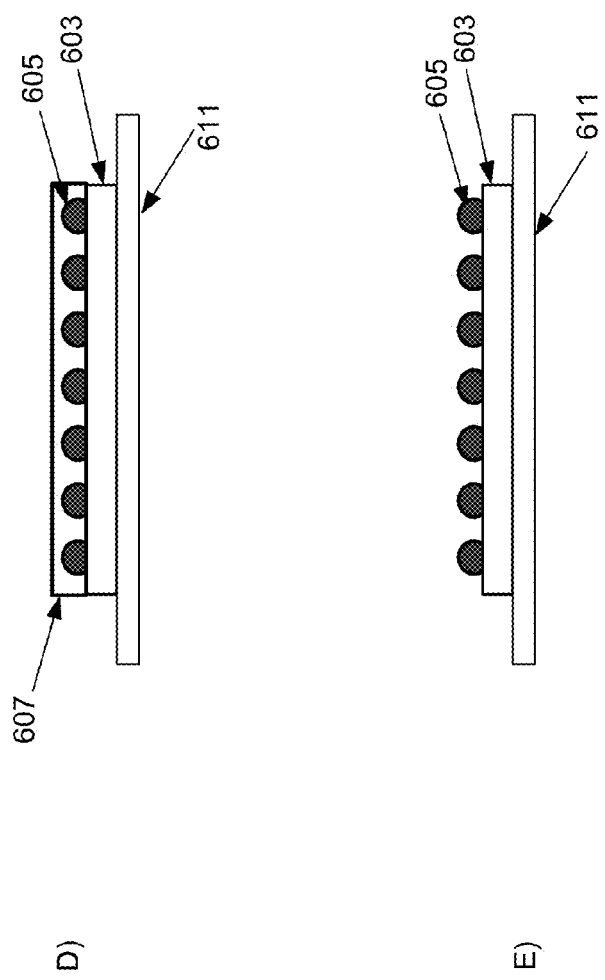

The cleaned structure may then be affixed to a film frame 611 with the backside bumps 605 facing up, as shown in FIG. 6D, for example. The polymer layer 607 may then be removed either chemically or thermally followed by a surface clean, resulting in the bonded wafer 603 shown in FIG. 6E, for example. The film frame 611 may enable further processing and ease of transport for the bonded wafer 603.

Figure 7:
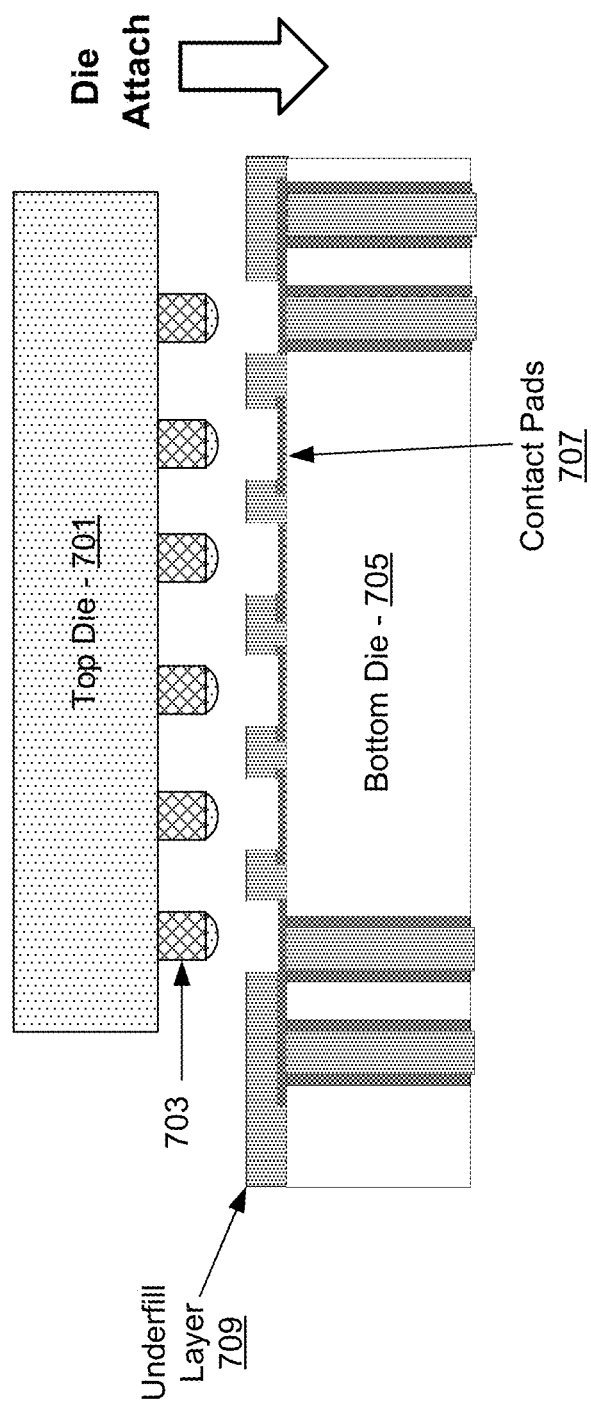
FIG. 7 is a diagram illustrating die bonding utilizing a patterned underfill layer, in accordance with an example embodiment of the invention.

FIG. 7 is a diagram illustrating die bonding utilizing a patterned underfill layer, in accordance with an example embodiment of the invention. Referring to FIG. 7, there is shown a top die 701 with microbumps 703 and a bottom die 705 comprising contact pads 707 and an underfill layer 709.

In an example scenario, the microbumps 703 may comprise copper pillars, for example, and may correspond to the contact pads 707 in the bottom die 705. Although the bottom die 705 is shown as a single die, in another example scenario, it may comprise an entire wafer of die, with a plurality of top die 701 being bonded to an interposer wafer 705 as opposed to a single die. The underfill layer 709 may comprise a polymer applied to the top surface of the bottom die 705 that the next level die, e.g., the top die 701, will be bonded to. The polymer may comprise a re-passivation or pre-applied underfill that will flow and bond to both die surfaces negating the need for subsequent underfill processes.

Furthermore, the underfill layer 709 may be patterned utilizing photolithography techniques or laser ablation to expose the appropriate contact pads 707 in the bottom die 705, for example by forming wells in the underfill layer 709. The layer 709 may comprise a film where the openings may comprise full depth pockets or partial depth pockets, for example, generated using laser ablation or photolithography techniques. Material remaining in the partial depth pockets may assist in the bonding process of the top die 701 to the bottom die 705, for example.

The exposed pads may be utilized to align the top die 701 to the bottom die 705. The die may be bonded utilizing a thermal compression or mass reflow technique, for example. A flux dip may be utilized to aid in wetting of solder from one surface to the other and the underfill may "snap-cure" and seal both to the top and bottom die surfaces. Furthermore the underfill may flow around and under the microbumps 703 and the contact pads 707 during the bond process.

In an embodiment of the invention, a method and system are disclosed for a semiconductor device package 100, 150 with a die to interposer wafer first bond. In this regard, aspects of the invention may comprise bonding a plurality of semiconductor die 101, 121, 203A-203C, 405, 505, 701 comprising electronic devices to an interposer wafer 127, 201, and in instances where wafer 603 comprises an interposer wafer, 603, and applying an underfill material 210, 217, 709 between the plurality of semiconductor die 101, 121, 203A-203C, 405, 505, 701 and the interposer wafer. A mold material 211, 303 may be applied to encapsulate the plurality of semiconductor die 101, 121, 203A-203C, 405, 505, 701.

The interposer wafer 127, 201, and in instances where wafer 603 comprises an interposer wafer, 603, may be thinned to expose through-silicon-vias (TSVs) and metal contacts 213, 707 may be applied to the exposed TSVs. The interposer wafer 127, 201, and in instances where wafer 603 comprises an interposer wafer, 603, may be singulated to generate a plurality of assemblies 100, 150 each comprising one or more of the plurality of semiconductor die 101, 121, 203A-203C, 405, 505, 701 and an interposer die 107, 201A, 407, 507, 705. The one or more of the plurality of assemblies may be bonded to one or more packaging substrates 103. The plurality of die 101, 121, 203A-203C, 405, 505, 701 may be placed on the interposer wafer 127, 201, and in instances where wafer 603 comprises an interposer wafer, 603, for the bonding utilizing an adhesive film 611.

The interposer wafer 127, 201, and in instances where wafer 603 comprises an interposer wafer, 603, may be singulated utilizing one or more of: a laser cutting process, reactive ion etching, a sawing technique, and a plasma etching process. The underfill material 210, 217, 709 may be applied utilizing a capillary underfill process. The plurality of semiconductor die 101, 121, 203A-203C, 405, 505, 701 may be bonded to the interposer wafer 127, 201, and in instances where wafer 603 comprises an interposer wafer, 603, utilizing a mass reflow process or a thermal compression process.

The one or more additional die 101, 121, 203A-203C, 405, 505, 701 may be bonded to the plurality of semiconductor die 101, 121, 203A-203C, 405, 505, 701 utilizing a mass reflow processor a thermal compression process. The mold material 211, 303 may comprise a polymer. The one or more additional die 101, 121, 203A-203C, 405, 505, 701 may comprise micro-bumps for coupling to the plurality of semiconductor die 101, 121, 203A-203C, 405, 505.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for semiconductor packaging, the method comprising:
    applying an underfill material on an interposer wafer;
    forming wells in the underfill material on the interposer wafer;
    positioning a plurality of semiconductor die in relation to the interposer wafer utilizing a temporary adhesive film that is bonded to a first surface of the plurality of semiconductor die opposite a second surface of the plurality of semiconductor die, said second surface comprising micro-bumps;
    bonding the plurality of semiconductor die to the interposer wafer by, at least in part, aligning the micro-bumps with the wells;
    applying a mold material to encapsulate said plurality of semiconductor die;
    thinning said interposer wafer to expose through-silicon-vias (TSVs);
    applying metal contacts to said exposed TSVs;
    singulating said interposer wafer to generate a plurality of assemblies each comprising one or more of said plurality of semiconductor die and an interposer die; and
    bonding one or more of said plurality of assemblies to one or more packaging substrates.

2. The method according to claim 1, wherein the adhesive film comprises an adhesive tape or compliant layer.

3. The method according to claim 1, wherein the micro-bumps comprise copper.

4. The method according to claim 1, wherein said singulating said interposer wafer comprises singulating said interposer wafer utilizing one or more of: a laser cutting process, reactive ion etching, a sawing technique, and a plasma etching process.

5. The method according to claim 1, wherein said thinning said interposer wafer comprises thinning said interposer wafer after said plurality of semiconductor die have been bonded to said interposer wafer.

6. The method according to claim 1, comprising removing at least said interposer wafer from a support substrate, said removing comprising:
    forming a protective layer over backside bumps on said interposer wafer;
    attaching a first chuck to said protective layer;
    attaching a second chuck to said support substrate; and
    causing relative motion between said attached first chuck and said attached second chuck.

7. The method according to claim 1, wherein said micro-bumps comprise copper pillars.

8. The method according to claim 1, wherein said forming wells comprises forming the wells only partially through the underfill material on said interposer wafer.

9. The method according to claim 8, wherein said forming comprises forming the wells in the underfill material on the interposer wafer using one or more of photolithography and/or laser ablation.

10. The method according to claim 1, wherein said applying an underfill material comprises applying said underfill material as a film.

11. The method according to claim 1, wherein said bonding the plurality of semiconductor die to the interposer wafer comprises bonding the plurality of semiconductor die to said interposer wafer utilizing a mass reflow process.

12. The method according to claim 1, wherein said bonding the plurality of semiconductor die to the interposer wafer comprises comprising bonding the plurality of semiconductor die to the interposer wafer utilizing a thermal compression process.

13. The method according to claim 1, comprising bonding one or more additional die to said plurality of semiconductor die utilizing a mass reflow process.

14. The method according to claim 1, comprising bonding one or more additional die to said plurality of semiconductor die utilizing a thermal compression process.

15. The method according to claim 1, wherein said mold material comprises a polymer.

16. A method for semiconductor packaging, the method comprising:
    applying an underfill material to a front side of an interposer;
    forming wells in the underfill material on the interposer;
    bonding a first semiconductor die to the front side of the interposer by, at least in part, aligning micro-bumps on the semiconductor die with the wells formed in the underfill material;

applying a mold material to encapsulate said first semiconductor die;
thinning said interposer to expose through-silicon-vias (TSVs); and
applying metal contacts to said exposed TSVs.

17. The method according to claim 16, comprising
bonding a second semiconductor die to the front side of the interposer;
singulating said interposer to generate a plurality of assemblies, and
bonding one or more of said plurality of assemblies to one or more packaging substrates,
wherein said plurality of assemblies comprise:
    a first assembly comprising the first semiconductor die and a first interposer die singulated from the interposer; and
    a second assembly comprising the second semiconductor die and a second interposer die singulated from the interposer.

18. The method according to claim 16, wherein said thinning said interposer comprises thinning said interposer after said first semiconductor die has been bonded to said interposer.

19. The method according to claim 16, wherein said forming wells comprises forming the wells only partially through the underfill material on the interposer.

20. A method for semiconductor packaging, the method comprising:
applying an underfill material on an interposer wafer;
forming wells only partially through the underfill material on the interposer wafer;
positioning a plurality of semiconductor die in relation to said interposer wafer utilizing a temporary adhesive film that is bonded to a first surface of the plurality of semiconductor die opposite a second surface of the plurality of semiconductor die, said second surface comprising micro-bumps;
bonding said plurality of semiconductor die comprising electronic devices to a front side of said interposer wafer by, at least in part, aligning the micro-bumps with the well;
applying a mold material to encapsulate said plurality of semiconductor die;
applying metal contacts to through silicon vias (TSVs) exposed in said interposer wafer;
singulating said interposer wafer to generate a plurality of assemblies each comprising one or more of said plurality of semiconductor die and an interposer die; and
bonding one or more of said plurality of assemblies to one or more packaging substrates.

* * * * *